(12) United States Patent
Raychaudhuri et al.

(10) Patent No.: US 6,579,629 B1
(45) Date of Patent: Jun. 17, 2003

(54) CATHODE LAYER IN ORGANIC LIGHT-EMITTING DIODE DEVICES

(75) Inventors: Pranab K. Raychaudhuri, Rochester, NY (US); Ching W. Tang, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 126 days.

(21) Appl. No.: 09/636,494

(22) Filed: Aug. 11, 2000

(51) Int. Cl.[7] .............................. H01L 51/20; H01J 1/62; C09K 11/00
(52) U.S. Cl. ...................... 428/690; 428/917; 313/504; 313/506; 313/503
(58) Field of Search ................................ 428/690, 917; 313/502, 503, 504, 505, 506

(56) References Cited

U.S. PATENT DOCUMENTS

| 4,720,432 | A | | 1/1988 | VanSlyke et al. | 428/457 |
|---|---|---|---|---|---|
| 4,769,292 | A | | 9/1988 | Tang et al. | 428/690 |
| 4,885,211 | A | | 12/1989 | Tang et al. | 428/457 |
| 5,645,948 | A | | 7/1997 | Shi et al. | 428/690 |
| 5,776,623 | A | * | 7/1998 | Hung et al. | 428/690 |
| 5,935,721 | A | | 8/1999 | Shi et al. | 428/690 |
| 5,972,247 | A | | 10/1999 | Shi et al. | |
| 6,013,384 | A | * | 1/2000 | Kido et al. | 428/690 |
| 6,020,078 | A | | 2/2000 | Chen et al. | 428/690 |
| 6,137,223 | A | * | 10/2000 | Hung et al. | 313/506 |
| 6,248,458 | B1 | * | 6/2001 | Yoon et al. | 428/690 |
| 6,274,979 | B1 | * | 8/2001 | Celii et al. | 313/506 |

FOREIGN PATENT DOCUMENTS

| DE | 198 07 370 | 2/1998 |
|---|---|---|
| EP | 0 876 086 | 11/1998 |
| EP | 0 880 305 | 11/1998 |
| EP | 0 880 307 | 11/1998 |
| EP | 0 982 783 | 3/2000 |

OTHER PUBLICATIONS

"31:4: Fabrication of Lithium–Based Alloy Cathodes for Organic Light–Emitting Diodes by D C Magnetron Sputtering" by P.K. Raychaudhuri, C.W. Tang, and J.K. Madathil, SID 01 Digest, Jun. 2001, pp. 526–529.

"Ion–Beam–Induced Surface Damages on tris–(8–hydroxyquinoline) aluminum" by L. S. Liao, Applied Physics Letter, vol. 75, No. 11, Sep. 13, 1999, pp. 1619–1621.

"Sputter Deposition of Cathodes in Organic Light Emitting Diodes" by L. S. Hung, Journal of Applied Physics, vol. 86, No. 8, Oct. 15, 1999, pp. 4607–4612.

* cited by examiner

*Primary Examiner*—Cynthia H. Kelly
*Assistant Examiner*—Dawn Garrett
(74) *Attorney, Agent, or Firm*—Raymond L. Owens

(57) ABSTRACT

An OLED device including a substrate, an anode formed of a conductive material over the substrate, and an emissive layer having an electroluminescent material provided over the anode. The OLED device also includes a buffer structure having at least two layers, a first buffer layer provided over the emissive layer and containing an alkaline halide and a second buffer layer provided over the first buffer layer and containing phthalocyanine, and a sputtered cathode layer having an alloy containing an alkaline metal provided over the buffer structure.

10 Claims, 1 Drawing Sheet

OLED device structure

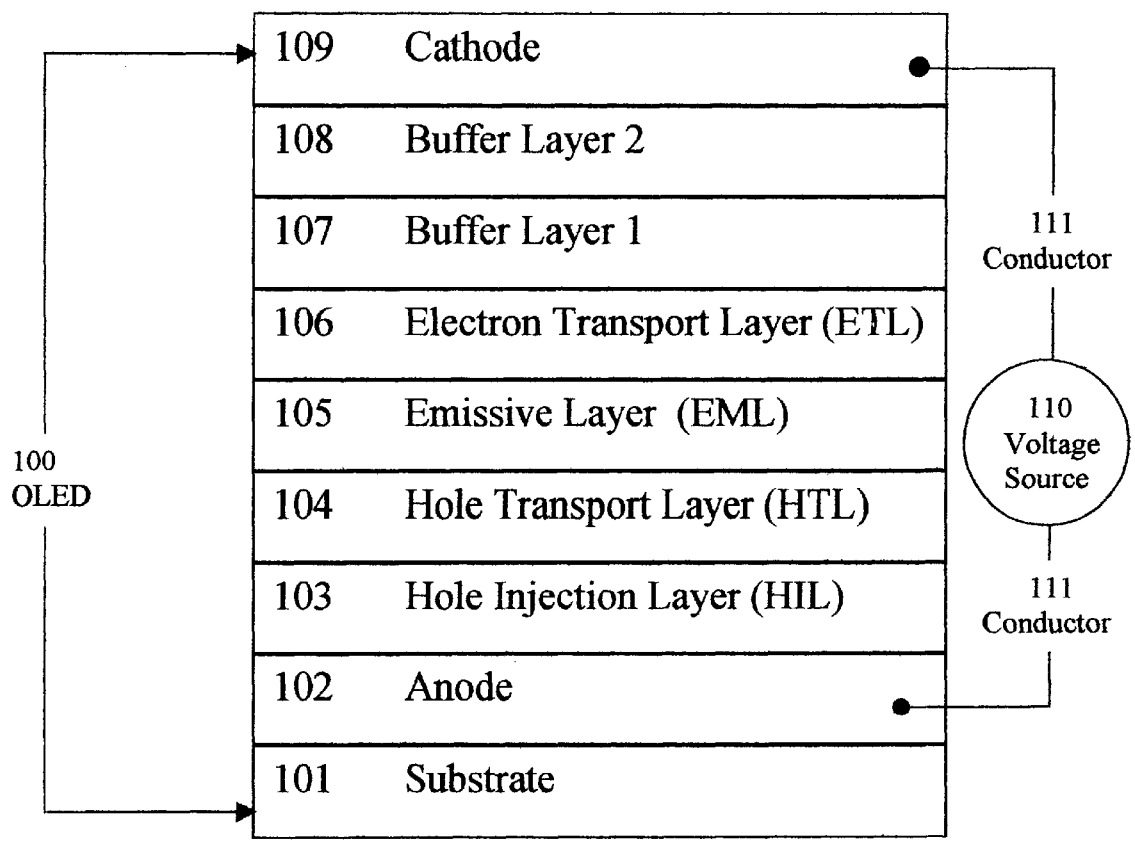
Figure 1. OLED device structure

CATHODE LAYER IN ORGANIC LIGHT-EMITTING DIODE DEVICES

FIELD OF THE INVENTION

The present invention relates to organic light-emitting diode devices and methods for making such devices, which use a sputtered cathode layer.

BACKGROUND OF THE INVENTION

Organic electroluminescent device (OEL device), alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and viewable from oblique angles. These unique attributes are derived from a basic OLED structure comprising of a multilayer stack of organic thin films sandwiched between an anode and a cathode. Tang et al in U.S. Pat. Nos. 4,769,292 and 4,885,211 has disclosed such a structure. A common OLED structure includes of a bi-layer organic stack of a hole-transport layer and an electron transport layer, typically of the order of a few hundred angstroms thick for each layer. The anode material is usually an optically transparent indium-tin oxide (ITO) glass, which also serves as the substrate for the OLED. The cathode is usually a metallic thin film.

In the fabrication of OLED vapor deposition is used. Using this method, the organic layers are deposited in thin-film form onto the ITO glass substrate in a vacuum chamber, followed by the deposition of the cathode layer. Among the deposition methods for the cathode, vacuum deposition using resistive heating or electron-beam heating has been found to be most suitable because it does not cause damage to the organic layers. However, it would be highly desirable to avoid these methods for fabrication of the cathode layer. This is because they are inefficient processes. In order to realize low cost manufacturing one must adopt and develop a proven robust high throughput industrial process specific to OLEDs fabrication. Sputtering has been used as such a method of choice for thin film deposition in many industries. Conformal, dense, and adherent coatings, short cycle time, low maintenance of coating chamber, efficient use of materials are among few of the benefits of sputtering.

The fabrication of the OLED cathode layer employing high-energy deposition process such as sputtering is not commonly practiced because of the potential damage inflicted on the organic layers, and thus degradation of the OLED performance. Sputter deposition takes place in a complex environment that comprises of energetic neutrals, electrons, positive and negative ions and emissions from the excited states that can degrade the organic layers upon which the cathode is deposited.

Liao et. al (Appl. Phys. Lett. 75,1619 [1999]) investigated using x-ray and ultraviolet photoelectron spectroscopies the damages induced on Alq surfaces by 100 eV Ar+irradiation. It is revealed from core level electron density curves that some N—Al and C—O—Al bonds in Alq molecules were broken. The valance band structure is also tremendously changed implying the formation of a metal-like conducting surface. It is suggested that this would cause nonradiative quenching in OLEDs when electrons are injected into the Alq layer from the cathode and also would results in electrical shorts.

During sputter deposition of cathode the Alq surface is subjected to high doses of Ar$^+$ bombardments at several hundred volts. As shown by Hung et. (J. Appl. Phys. 86, 4607 [1999]) that a dose only of $9 \times 10^{14}/cm^2$ altered the valance band structure. However, sputtering a cathode on Alq surface in Ar atmosphere would degrade the device performance.

Sputtering damage is somewhat controllable, at least to some extent, by properly selecting the deposition parameters. In the European patent applications EP 0 876 086 A2, EP 0 880 305 Al, and EP 0 880 307 A2, Nakaya et al. of TDK Corporation disclose a method of depositing a cathode by a sputtering technique. After depositing all organic layers, with vacuum still kept, the devices was transferred from the evaporation to a sputtering system wherein the cathode layer was deposited directly on the emission layer. The cathode was an Al alloy comprised of 0.1–20 a % Li that additionally contained at least one of Cu, Mg and Zr in small amounts and in some cases had a protective overcoat. The OLED devices thus prepared using no buffer layer were claimed to have good adhesion at the organic layer/electrode interface, low drive voltage, high efficiency and exhibited a slower rate of development of dark spot. Grothe et al. in patent application DE 198 07 370 C1 also disclose a sputtered cathode of an Al:Li alloy which had relatively high Li content and having one or more additional elements chosen from Mn, Pb, Pd, Si, Sn, Zn, Zr, Cu and SiC. In all of those examples no buffer was used, yet electroluminescent was produced at lower voltage. Some sputtering damage was possibly controlled by employing a low deposition rate. It is easily anticipated that by lowering sputtering power the damage inflicted on the organic layers can be reduced. At low power, however, the deposition rate can be impracticably low and the advantages of sputtering are reduced or even neutralized.

To realize high speed sputtering a plasma resistant coating on electron transport/emissive layer may necessary. It is known that a layer containing robust molecules can be effective in significantly reducing the damage inflicted on to emissive and other underlying layers during cathode sputtering deposition. The buffer layer, however, in addition to being resistant to plasma, must not interfere with the operation of the device and must preserve the device performance as much as possible. Hung et. Al (J. Appl. Phys. 86, 4607 [1999]) disclosed the application a cathode buffer layers that permitted high-energy deposition of a cathode. The cathode contained a dopant, e.g. Li, which was believed to diffuse through the buffer layer and provided an electron injecting layer between the organic light emitting structure and the buffer layer. In the patent application EP 0 982 783 A2 Nakaya et al. disclose a cathode of Al:Li alloy. The cathode was prepared by sputtering using a buffer layer constructed of a porphyrin or napthacene compound that was deposed between the emission and the cathode. The device containing the sputtered electrode exhibited low drive voltage, high efficiency and retarted dark spot growth.

SUMMARY OF THE INVENTION

It is therefore an object of the present invention to provide an OLED device structure, which has reduced sputtering damage.

The above object was achieved by using sputtering as the method for deposition of the OLED cathode and an OLED device comprising:
 a) a substrate;
 b) an anode formed of a conductive material over the substrate;

c) an emissive layer having an electroluminescent material provided over the anode;

d) a buffer structure including at least two layers, a first buffer layer provided over the emissive layer and containing an alkaline halide and a second buffer layer provided over the first buffer layer and containing phtlalocyanine; and e) a sputtered cathode layer having an alloy containing an alkaline metal provided over the buffer structure.

An advantage of the present invention is that cathode sputtering damage can be reduced in OLED devices and displays. The method permits high and uniform deposition rate and is suitable for high process throughput and large-area substrates.

The buffer structure in accordance with the invention having two buffer layers exhibited substantially superior performance in comparison to that of devices having only one buffer layer but otherwise identical in structure.

Another advantage of the present invention is that OLED devices produced by the sputtering deposition method are efficient and operable with a low drive voltage.

BRIEF DESCRIPTION OF THE DRAWINGS

FIG. 1 shows schematically the layer structure of the OLED device.

DETAILED DESCRIPTION OF THE INVENTION

Throughout the ensuring description acronyms are used to designate the names of different layers and operating features of organic light-emitting diode devices. For reference, they are listed in Table 1.

TABLE 1

| | |
|---|---|
| OLED | Organic light emitting diode |
| ITO | Indium tin oxide |
| HIL | Hole injection layer |
| HTL | Hole transport layer |
| EML | Emissive layer |
| ETL | Electron transport layer |
| NPB | 4,4'-Bis[N-(1-naphthyl)-N-phenylamino]biphenyl (NPB) |
| Alq | Tris(8-hydroxyquinoline) aluminum |
| C545T | 1H,5H,11H-[1]Benzopyrano[6,7,8-ij]quinolizin-11-one,10-(2-benzothiazolyl)-2,3,6,7-tetrahydro-1,1,7,7-tetramethyl-(9CI) |
| ADN | 9,10-Di(2-naphthalenyl)anthracene |
| DCJTB | 4-(Dicyanomethylene)-2-t-butyl-6-(1,1,7,7-tetramethyljulolidyl-9-eny)-4H-pyrane |
| TBP | 2,5,8,11-tetrakis(1,1-dimethylethyl)perylene |
| CuPc | Copper phthalocyanine |
| Mg:Ag | Magnesium silver alloy |
| Al:Li | Aluminum lithium alloy |
| Ag:Li | Silver lithium alloy |

Turning now to FIG. 1, the OLED device 100 of this invention comprises a substrate 101, an anode 102, a hole injection layer (HIL) 103, a hole transport layer (HTL) 104, an emissive layer (EML) 105, an electron transport layer (ETL) 106, two buffer layers 107 and 108, and a cathode 109. In operation, the anode and the cathode are connected to a voltage source 110 via conductors 111 and electrical current is passed through the organic layers, resulting in light emission or electroluminescence from the OLED device. Depending on the optical transparency of the anode and cathode, electroluminescence can be viewed from either the anode side or the cathode side. The intensity of the electroluminescence is dependent on the magnitude of the electrical current that is passed through the OLED device, which in term is dependent on the luminescent and electrical characteristics of the organic layers as well as the charge injecting nature of the contacting electrodes.

The composition and the function of the various layers constituting the OLED device are described as follows:

Substrate 101 may include thin glass, ceramic, or plastics. Since the OLED device fabrication does not require high temperature process, any substrate that can withstand process temperatures on the order of 100° C. is useful, which include most thermal plastics. The substrate may take the form of rigid plate, flexible sheet, or curved surfaces. Substrate 101 may include support with electronic backplane, and thus includes active-matrix substrates, which contain electronic addressing and switching elements. Examples of such active-matrix substrates include single-crystal silicon wafer with CMOS circuit elements, substrates with high-temperature polysilicon thin-film-transistors, substrates with low-temperature polysilicon thin-film-transistors, substrates with amorphous silicon transistors, or any substrates with thin-film-transistor and other circuit elements that are be used to address and drive the OLED devices.

Anode 102 provides the function of injecting hole into the organic layer when a positive potential relative to the cathode is applied to the OLED. It has been shown, for example in U.S. Pat. No. 4,720,432, that indium tin oxide (ITO) forms an efficient anode because it has a relatively high work function. Since ITO film itself is transparent, ITO coated glass provides an efficient support for the fabrication of OLED devices. Other suitable anode materials include high work function metals such as Au, Pt, Pd, or alloys of these metals.

Hole injecting layer (HIL) 103 provides the function of increasing the efficiency of the hole injection from the anode into the organic layers. It has been shown, for example in U.S. Pat. No. 4,885,211, that a porphorinic or phthalocyanine compound is useful as a hole injection layer, resulting in increased luminance efficiency and operational stability. Other preferred HIL materials include CFx (0<x≦2) which is a fluorinated polymer deposited by plasma-assisted vapor deposition. The method of preparation and the characteristics of CFx are well known and also have been disclosed in U.S. Pat. No. 5,972,247.

Hole transport layer (HTL) 104 provides the function of transporting holes to the emissive layer (EML) 105. HTL materials include various classes of aromatic amines as disclosed in commonly assigned U.S. Pat. No. 4,720,432. A preferred class of HTL materials includes the tetraaryl-diamines of formula (I).

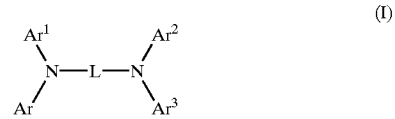

wherein:

Ar, $Ar^1$, $Ar^2$ and $Ar^3$ are independently selected from among phenyl, biphenyl and naphthyl moieties;

L is a divalent naphthylene moiety or $d_n$;

d is a phenylene moiety;

n is an integer of from 1 to 4; and at least one of Ar, $Ar^1$, $Ar^2$ and $Ar^3$ is a naphthyl moiety.

Useful selected (fused aromatic ring containing) aromatic tertiary amines are the following:

4,4'-Bis[N-(1-naphthyl)-N-phenylamino]biphenyl (NPB)
4,4''-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthatene
2,6-Bis[di-(1-naphtyl)amino]naphthalene Emissive layer 105 of FIG. 1 provides the function of light emission produced as a result of recombination of holes and electrons in this layer. A preferred embodiment of the emissive layer comprises of a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for OLED devices using Alq as the host material. As set forth in the Tang et al. U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; alkyl substituted 9,10 dinaphthyl anthracene, as disclosed in Shi et al. U.S. Pat. No. 5,935,721.

Dopant materials include most fluorescent and phorphorescent dyes and pigments. Preferred dopant materials include coumarins such as Coumarin 6, dicyanomethylenepyrans such as 4-dicyanomethylene-4H pyrans, as disclosed in Tang et al. U.S. Pat. No. 4,769,292 and in Chen et al. in U.S. Pat. No. 6,020,078.

Electron transport layer 106 of FIG. 1 provides the function of delivering electrons injected from the cathode to the emissive layer 105. Useful materials include Alq, benzazoles, as disclosed in Shi et al. U.S. Pat. No. 5,645,948.

Buffer layer 1 (107) and buffer layer 2 (108) of FIG. 1 provide the function of controlling the sputter damage during the deposition of the cathode and thereby preserve or enhance the performance of the OLED device. In contrast to prior art, it has been found that both buffer layers are necessary in order to minimize the sputter damage. Buffer layer 1, which is adjacent to the electron transport layer, includes materials belonging to the alkaline halide group. Preferred materials include LiF, NaCl, KI, CsF, CsI. These materials are sublimable and can be deposited in a thin film form using conventional vapor deposition methods. Since they are electrical insulators, the useful range of thickness for buffer layer 1 using these materials should be no greater than 100 angstroms. The preferred range of thickness is less than 3 nm angstroms and greater than 0 nm.

Buffer layer 2 (108) of FIG. 1 includes the phthalocyanines. Useful materials include phthalocyanines described in the monograph, "Phthalocyanine Materials" by Neil B. McKeown, Cambridge University Press. 1998, page 3. It has been shown by Hung et al. (J. Appl. Phys. 86, 4607 [1999]) that copper phthalocyanine is useful as an electron transport layer as well as a buffer layer for controlling the damage to the organic layers during sputtering deposition of the cathode. However, as will be shown in the examples of this invention, in the absence of buffer layer 1, buffer layer 2 is considerably less effective in reducing sputter damage, resulting in OLED devices with lower luminance efficiency and higher drive voltage. The provision of both buffer layer 1 and buffer layer 2 is required in accordance with the invention to minimize cathode sputter damage. The advantageous results from using these two layers are indeed quite unexpected. It should be noted that the ordering of the buffer layers can be quite important in minimizing damage to the organic layers. That is, buffer layer 1 is preferably disposed adjacent to the electron transport layer and the buffer layer 2 is disposed over buffer layer 1. The thickness of the buffer layer 2 should be in a range of less than 200 nm but greater than 0 nm. The preferred range of thickness for buffer layer 2 is from 5 to 100 nm. The preferred materials include metal or metal-free phthalocyanines, porphorinic compounds, and the aromatic sextets such as those described by E. Clar in "Aromatic Sextet", John Wiley & Sons, 1972.

Cathode (109) of FIG. 1 provides the function of injecting electron into the OLED organic layers. Sputter deposition is preferred because it is a robust thin-film deposition process. The sputtering process employed in the present investigations was as follows:

After the deposition of the buffer layer 2, the devices were transferred from the evaporation chamber to a sputtering chamber. The sputtering apparatus was equipped with a 2 inch diameter DC sputter gun and a 1 KW DC power supply. Targets used in this investigations were constituted of 3 w % Li and 97 w % Al and 0.3 w % Li and 99.7 w % Ag.

The substrates were placed on a carousal type stage over the target. The target-to-substrate distance was 3 inch. The chamber was evacuated to less than $1\times10^{-6}$ Torr and back-filled with pure Ar to maintain a fixed pressure, typically 16 mT (milli-Torr). The sputtering power applied to the target was 150 W typically, resulting in a deposition rate of about 7.8 A/s for Al:Li films and 22 A/s for Ag:Li films. The deposition parameters such as power and deposition time were varied in this investigation to produce the desired film thickness. Although DC sputtering from a single alloy target was preferred, RF can also be used as an alternate power source, and simultaneous sputtering of multiple targets can be employed for increased process throughput. It is also understood that co-sputtering of several targets instead of a single alloy can be utilized for adjusting the composition of the alloy cathode layer.

Although the FIG. 1 embodiment is believed preferred, it will be appreciated by those skilled in the art that a device can also be made which does not use hole injection layer 103, hole transport layer 104 and electron transport layer 106. Those skilled in the art will appreciate that the emissive layer can be selected to include hole transport and electron transport functions and the anode layer can function as the hole injection layer. In such an instance, the device requires 105 and does not require layers 103, 104, and 106.

EXAMPLES

In the following examples, reference should be made to Table 1 for the appropriate structure and operating parameters corresponding to the listed acronym. In these tables V (volt) refers to the voltage required to pass 20 mA/cm$^2$ through the device, and L (cd/m$^2$) refers to the luminance of the OLED device under this condition.

| Comparative Examples: Effect of buffer layers in OLED with evaporated MgAg cathode | | | | |
|---|---|---|---|---|
| Layer | Material | Ex. 1 Tkn(nm) | Ex.2 Tkn(nm) | Ex.3 Tkn(nm) |
| Anode | ITO | 42 | 42 | 42 |
| HIL | CFx | 1 | 1 | 1 |
| HTL | NPB | 75 | 75 | 75 |
| EML | Alq | 75 | 75 | 75 |
| ETL | Alq | 0 | 0 | 0 |
| Buffer 1 | LiF | 0 | 0.4 | 0.4 |
| Buffer 2 | CuPc | 0 | 0 | 20 |
| Cathode | MgAg | 220 | 220 | 220 |
| L (cd/m$^2$) | | 488 | 482 | 20 |
| V (volt) | | 6.2 | 6 | 11.3 |

For evaporated MgAg cathode it is seen from the device data of Example 1 and Example 2 that buffer layer 1 has no significant effect on OLED performance. From the data of Example 3 it is easily seen that incorporation of buffer layer 2 resulted in severe degradation of device performance as evidenced by very high voltage and very low luminance.

| Comparative Examples: Effect of buffer layers in OLED with sputtered Al:Li cathode | | | | | | |
|---|---|---|---|---|---|---|
| Layer | Material | Ex.4 Tkn (nm) | Ex.5 Tkn (nm) | Ex.5A Tkn (nm) | Ex.5B Tkn (nm) | Ex.5C Tkn (nm) |
| Anode | ITO | 42 | 42 | 42 | 42 | 42 |
| HIL | CFx | 1 | 1 | 1 | 1 | 1 |
| HTL | NPB | 75 | 75 | 75 | 75 | 75 |
| EML | Alq | 75 | 75 | 75 | 75 | 75 |
| ETL | Alq | 0 | 0 | 0 | 0 | 0 |
| Buffer 1 | LiF | 0.4 | 0 | 0.4 | 0.5 | 1.0 |
| Buffer 2 | CuPc | 0 | 20 | 20 | 20 | 20 |
| Sputtered Cathode | Al:Li(3 w %) | 390 | 47 | 39 | 47 | 47 |
| L (cd/m$^2$) | | 165 | 358 | 482 | 465 | 470 |
| V (volt) | | 10.3 | 7.8 | 6.2 | 6.1 | 6.3 |

For sputtered Al:Li cathode it is seen from the device data of Example 4 and Example 5 that only one buffer layer—buffer layer 1 or buffer layer 2 is ineffective in preventing sputter damage as evidenced by high voltage and low luminance. Two buffer layers in combination presented in the device data for Examples 5A, 5B and 5C minimized the sputter damage as evidenced by low voltage and high luminance. The OLED performance for these devices is very similar to that of the evaporated MgAg cathode device of Example 2. The device data for Examples 5A, 5B and 5C reveal that buffer layer 1 thickness in the range from 0.4 nm to 1.0 nm has no significant effect on OLED performance.

| Comparative Examples: Effect of the deposition order of buffer layers in OLED with sputtered Al:Li cathode | | | | | |
|---|---|---|---|---|---|
| Layer | Material | Ex. 6 Tkn(nm) | Ex.7 Tkn(nm) | Ex. 8 Tkn(nm) | Ex.9 Tkn(nm) |
| Anode | ITO | 42 | 42 | 42 | 42 |
| HIL | CFx | 1 | 1 | 1 | 1 |
| HTL | NPB | 75 | 75 | 75 | 75 |
| EML | Alq | 75 | 75 | 75 | 75 |
| ETL | Alq | 0 | 0 | 0 | 0 |
| Buffer 1 | LiF | 0.5 | 0 | 1 | 0 |
| Buffer 2 | CuPc | 20 | 20 | 20 | 20 |
| Buffer 1 | LiF | 0 | 0.5 | 0 | 1 |
| Sputtered Cathode | Al:Li (3 w %) | 470 | 47 | 47 | 47 |
| L (cd/m$^2$) | | 465 | 374 | 470 | 382 |
| V (volt) | | 6.1 | 7.5 | 6.3 | 7.4 |

It is seen from the device data of Example 6 through Example 9 that the order of deposition of buffer layers is important. The preferred order is buffer layer 1 on Alq and buffer layer 2 on buffer layer 1. Reversing the order buffer layers caused degradation of OLED performance as evidenced by comparatively higher voltage and lower luminance.

| Comparative Examples: Effect of sputtering deposition rate of Al:Li | | | |
|---|---|---|---|
| Layer | Material | Ex.10 Tkn(nm) | Ex.11 Tkn(nm) |
| Anode | ITO | 42 | 42 |
| HIL | CFx | 1 | 1 |
| HTL | NPB | 75 | 75 |
| EML | Alq | 75 | 75 |
| ETL | Alq | 0 | 0 |
| Buffer 1 | LiF | 4 | 4 |
| Buffer 2 | CuPc | 20 | 20 |
| Sputtered Cathode | Al:Li(3 w %) | 39 | 39 |
| Deposition rate, A/s | | 1.6 | 7.8 |
| L (cd/m$^2$) | | 478 | 482 |
| V (volt) | | 6.4 | 6.2 |

It is seen from the device data of Example 10 and Example 11 that increasing the deposition rate of cathode layer by a factor of 5 (achieved by increasing sputtering power) did not affect the OLED performance as evidenced by almost identical voltage and luminance.

| Comparative Examples: Ag:Li cathode. Effect of buffer layer thickness. | | | | |
|---|---|---|---|---|
| Layer | Material | Ex. 13 Tkn(nm) | Ex. 14 Tkn(nm) | Ex. 15 Tkn(nm) |
| Anode | ITO | 42 | 42 | 42 |
| HIL | CFx | 1 | 1 | 1 |
| HTL | NPB | 75 | 75 | 75 |
| EML | Alq | 75 | 75 | 75 |
| ETL | Alq | 0 | 0 | 0 |
| Buffer 1 | LiF | 0 | 0.2 | 1.5 |
| Buffer 2 | CuPc | 20 | 20 | 20 |
| Sputtered Cathode | Al:Li(0.3 w %) | 44 | 44 | 44 |
| L(cd/m$^2$) | | 278 | 460 | 458 |
| V (volt) | | 8.4 | 5.9 | 6.1 |

It is seen from the device data of Example 13 through Example 15 that Ag:Li cathodes function similar to Al:Li cathodes. The absence of buffer layer 1 in the device structure of Example 13 caused degradation of OLED performance as evidenced by the data of Example 15 and Example 16 that contain both buffer layers and exhibit lower voltage and higher luminance. The device data from Example 15 and Example 16 reveal that buffer layer 1 thickness in the range from 0.2 nm to 1.5 nm has no significant effect on OLED performance.

Comparative Examples: Effect of buffer layer thickness

| Layer | Material | Ex. 16 Tkn(nm) | Ex. 17 Tkn(nm) | Ex. 18 Tkn(nm) |
|---|---|---|---|---|
| Anode | ITO | 42 | 42 | 42 |
| HIL | CFx | 1 | 1 | 1 |
| HTL | NPB | 75 | 75 | 75 |
| EML | Alq | 75 | 40 | 40 |
| ETL | Alq | 0 | 0 | 0 |
| Buffer 1 | LiF | 0.5 | 0.5 | 0.4 |
| Buffer 2 | CuPc | 20 | 40 | 70 |
| Sputtered Cathode | Al:Li(3 w %) | 47 | 39 | 47 |
| L (cd/m$^2$) | | 465 | 427 | 426 |
| V (volt) | | 6.1 | 3.8 | 4.2 |

The device data of Example 16 through Example 18 show the effects of buffer layer 2 thickness in the range 20 nm to 70 nm on device performance. Note that devices of Example 17 and Example 18 are low voltage devices. For these two devices the emission layer is thin and their performance is not strongly affected due to CuPc layer thickness. Their luminance is low compared to device of Example 16. This is because the latter device consisted of an emission layer about twice as thick as that for the low voltage devices.

Examples: OLED with doped EML

| Layer | Material | Ex. 19 Tkn(nm) | Ex. 20 Tkn(nm) | Material | Ex. 21 Tkn (nm) | Ex. 22 Tkn (nm) |
|---|---|---|---|---|---|---|
| Anode | ITO | 85 | 85 | ITO | 85 | 85 |
| HIL | CFx | 1 | 1 | CFx | 1 | 1 |
| HTL | NPB | 75 | 75 | NPB | 75 | 75 |
| EML | Alq:C545T | 37 | 37 | ADN:TBP | 37 | 37 |
| ETL | Alq | 37 | 37 | Alq | 37 | 37 |
| Buffer 1 | LiF | 0 | 0.4 | LiF | 0 | 0.4 |
| Buffer 2 | CuPc | 30 | 30 | CuPc | 20 | 20 |
| Sputtered Cathode | Al:Li (3 w %) | 47 | 47 | Al:Li (3 w %) | 47 | 47 |
| L (cd/m$^2$) | | 1700 | 1835 | | 290 | 326 |
| V (volt) | | 6.8 | 5.9 | | 8.3 | 7.6 |

It is seen from Examples 19, and 21 that absence of buffer layer 1 resulted in lower efficiency compared to device 20 and device 22, respectively that have both buffer layers. It is clearly demonstrated here that for doped emissive layers too, two buffer layers are required to minimize sputter damaged as evidenced by lower voltage and higher luminance for device 20 and 22.

Examples: OLED with doped EML

| Layer | Material | Ex. 23 Tkn(nm) | Ex. 24 Tkn(nm) |
|---|---|---|---|
| Anode | ITO | 85 | 85 |
| HIL | CFx | 1 | 1 |
| HTL | NPB | 75 | 75 |
| EML | Alq:DCJTB | 37 | 37 |
| ETL | Alq | 37 | 37 |
| Buffer 1 | LiF | 0 | 0.4 |
| Buffer 2 | PbPc | 20 | 30 |
| Sputtered Cathode | Al:Li(3 w %) | 47 | 47 |
| L (cd/m$^2$) | | 341 | 495 |
| V (volt) | | 10.7 | 9.1 |

It is seen from Example 23 that absence of buffer layers 1 resulted in lower efficiency compared to device of Example 24 that contained both buffer layers. It is clearly demonstrated here that two buffer layers are required to minimize sputter damaged to OLED having an emissive layer doped with another dopant as evidenced by lower voltage and higher luminance for device 24. Note in these examples the material for the buffer layer 2 is lead phthalocyanine.

The invention has been described in detail with particular reference to certain preferred embodiments thereof, but it will be understood that variations and modifications can be effected within the spirit and scope of the invention.

PARTS LIST

| | |
|---|---|
| 100 | organic light emitting diode |
| 101 | substrate |
| 102 | anode |
| 103 | hole injection layer |
| 104 | hole transport layer |
| 105 | emissive layer |
| 106 | electron transport layer |
| 107 | buffer layer 1 |
| 108 | buffer layer 2 |
| 109 | cathode |
| 110 | voltage source |
| 111 | electrical conductors |

What is claimed is:

1. An OLED device, comprising:

a) a substrate;

b) an anode formed of a conductive material over the substrate;

c) an emissive layer having an electroluminescent material provided over the anode layer;

d) a buffer structure including at least two layers, a first buffer layer provided over the emissive layer and containing an alkaline halide and a second buffer layer provided over the first buffer layer and containing phthalocyanine, wherein the first buffer layer has a thickness less than 3 nm but greater than 0 nm and wherein the second buffer layer has a thickness less than 100 nm but greater than 5 nm; and e) a sputtered cathode layer having an alloy containing an alkaline metal provided over the buffer structure.

2. The OLED device of claim 1 wherein the alkaline halide includes LiF.

3. The OLED device of claim 1 wherein the phthalocyanine includes a metal phthalocyanine.

4. The OLED device of claim 1 wherein the Li containing alloy cathode layer is produced by sputtering a target containing at least 0.5 atomic % of Li.

5. The OLED device of claim 1 wherein the electron transport layer includes Alq.

6. The OLED device of claim 1 wherein the emissive layer contains one or more light emitting doped materials.

7. The OLED device of claim 1 wherein the emissive layer contains a green light-emitting doped material.

8. The OLED device of claim 1 wherein the emissive layer contains a blue light-emitting doped material.

9. The OLED device of claim 1 wherein the emissive layer contains a red light-emitting doped material.

10. An OLED device, comprising:

a) a substrate;

b) an anode formed of a conductive material over the substrate;

c) a hole injection layer provided over the anode layer;

d) a hole transport layer provided over the hole injection layer;

e) an emissive layer having an electroluminescent material provided over the hole transport layer;

f) an electron transport layer provided over the emissive layer;

g) a buffer structure including at least two layers, a first buffer layer provided over the electron transport layer and containing an alkaline halide and a second buffer layer provided over the first buffer layer and containing phthalocyanine, wherein the first buffer layer has a thickness less than 3 nm but greater than 0 nm and wherein the second buffer layer has a thickness less than 100 nm but greater than 5 nm; and h) a sputtered cathode layer having an alloy containing an alkaline metal provided over the buffer structure.

* * * * *